United States Patent [19]

Suzuki et al.

[11] Patent Number: 4,749,898
[45] Date of Patent: Jun. 7, 1988

[54] SUPERPRECISION POSITIONING DEVICE

[75] Inventors: Seizo Suzuki, Mitaka; Teruomi Nakaya, Machida; Yoshio Hayashi, Chofu, all of Japan

[73] Assignee: National Aerospace Laboratory of Science & Technology Agency, Tokyo, Japan

[21] Appl. No.: 13,523

[22] Filed: Feb. 11, 1987

[30] Foreign Application Priority Data

Oct. 2, 1986 [JP] Japan .................. 61-236701

[51] Int. Cl.⁴ ............... H02K 7/705; F16C 39/06; H02P 5/52
[52] U.S. Cl. ................... 310/114; 74/571 M; 310/80; 310/90.5
[58] Field of Search ............ 74/571, 571 M; 310/83, 310/112, 114, 90.5, 156, 80; 384/99

[56] References Cited

U.S. PATENT DOCUMENTS

| 2,592,237 | 4/1952 | Bradley | 74/571 |
| 3,234,816 | 2/1966 | von Thuengen | 74/571 |
| 3,385,624 | 5/1968 | Baclini | 74/571 |
| 4,300,807 | 11/1981 | Poubeau | 310/83 |
| 4,375,047 | 2/1983 | Nelson et al. | 310/112 |
| 4,560,263 | 12/1985 | Katsuma et al. | 310/323 |
| 4,597,613 | 7/1986 | Sudo | 310/90.5 |
| 4,649,307 | 3/1987 | Bech | 310/83 |
| 4,652,148 | 3/1987 | Olasz | 310/90 |

Primary Examiner—R. Skudy
Assistant Examiner—D. L. Rebsch
Attorney, Agent, or Firm—Armstrong, Nikaido, Marmelstein & Kubovcik

[57] ABSTRACT

A superprecision positioning device includes an output shaft rotor, a plurality of eccentric shaft rotors including an inner eccentric shaft rotor and an outer eccentric shaft rotor, and a bearing base cylinder, electrically rotating and driving mechanism portions being provided between the eccentric shaft rotor and the output shaft rotor, and between the outer eccentric shaft rotor and the bearing base cylinder, respectively, whereby the eccentric shaft rotors and the output shaft rotor may be independently rotated and controlled. With this arrangement, movement in three degrees of freedom may be achieved by translational movement and rotation of the output shaft in a two-dimensional surface, and if an axially movable support shaft is inserted in the output shaft, an article being positioned may be moved with four degrees of freedom in total, providing superprecision positioning in units of 1/10 micron.

5 Claims, 4 Drawing Sheets

SUPERPRECISION POSITIONING DEVICE

BACKGROUND OF THE INVENTION

This invention relates to a superprecision positioning device which can position a movable output shaft with high accuracy and with superfineness by movement in a two-dimensional surface caused by a composite eccentric rotor and rotation of an output shaft.

A conventional precision positioning device having a relatively narrow range and being heretofore generally known is designed so that where a one-dimensional surface is translated, a ball screw and a linear guide are combined, and the ball screw is rotated and moved by means of a pulse motor to effect positioning. The two-dimensional positioning device is used with the aforesaid one-dimensional positioning mechanism disposed perpendicular thereto.

A rotation positioning device for rotation indexing or the like used recently in machining or the like uses no gear and reduction device, but an electrically direct driving device has been developed which directly drives, rotates and controls an axial table.

Recently, in industrial robots used to assemble heavy articles, positioning of high torque and high precision has been required. Furthermore, in focus control of a laser beam and in a wiring process for integrated circuits, superfine movement is also required. In light of this, the development of a positioning device having a higher precision and capable of being used in the aforementioned fields has been demanded.

However, in the conventional positioning devices, the rotation of the pulse motor is converted into a linear motion by the ball screw to effect positioning in a one or two-dimensional surface. Problems incurred include backlash caused by a thread pitch of the ball screw, and thus repeatable precision in micron units cannot be obtained. In addition, in the rotation positioning device of the aforementioned electric direct drive, positioning of rotation may be carried out with relatively high precision but this merely handles positioning of rotation. This poses a problem in that the device cannot be applied to positioning of a two-dimensional surface by translational movement.

SUMMARY OF THE INVENTION

It is an object of this invention to provide a superprecision positioning device having high torque which can readily position, with high accuracy and superprecision, a rotational position of an output shaft table having a translational position within a two-dimensional surface.

A superprecision positioning device according to this invention is composed of an output shaft rotor, a plurality of eccentric shaft rotors including at least an inner eccentric shaft rotor and another eccentric shaft rotor, and a bearing base cylinder. Each of said eccentric shaft rotors constitutes a multiple eccentric shaft rotor which has a cylindrical inner wall eccentric relative to a cylindrical outer wall of a rotor and in which the inner eccentric shaft rotor is rotatably orderly inserted into and held in the cylindrical inner wall of the outer eccentric shaft rotor through a bearing. The output shaft rotor and the outer eccentric shaft rotor are rotatably inserted into and held in the cylindrical inner wall of the inner eccentric shaft rotor and the cylindrical inner wall of the bearing base cylinder, respectively, through bearings, and electrically rotating and driving mechanisms are respectively arranged between the output shaft rotor and the inner eccentric shaft rotor, between the eccentric shaft rotors and between the outer eccentric shaft rotor and the bearing base cylinder so that the eccentric shaft rotors and the output shaft rotor may be independently rotated and controlled.

The output shaft rotor according to this invention has three degrees of freedom, namely, translational motions of X and Y two-dimensional surfaces and a rotational motion about an axis. More accurately, each eccentric shaft rotor is independently rotated by an electrically rotating and driving mechanism, and the rotational motion of the eccentric rotor is superposed whereby the output shaft rotor inserted into the cylindrical inner wall of the inner eccentric shaft rotor takes a translational motion of two degrees of freedom within a plane perpendicular to said shaft.

The positioning function of the output shaft rotor will now be described with reference to FIG. 3 in the case where the eccentric shaft rotor comprises a combination of the outer eccentric shaft rotor and the inner eccentric shaft rotor.

An outer eccentric shaft rotor B has an inner cylindrical surface whose center axis is $Q_1$, offset by $l_1$ from a center axis P of a bearing base cylinder A, an inner eccentric shaft rotor C inserted into the inner cylindrical surface has an inner cylindrical surface whose center axis is $O_1$ offset by $l_2$ from the center axis $Q_1$ of the outer eccentric shaft rotor B, and an output shaft rotor D is inserted into the inner cylindrical surface.

It is now assumed that as shown in FIG. 3, the center $Q_1$ of the inner cylindrical surface of the outer eccentric shaft rotor B and the center $O_1$ in the inner cylindrical surface of the inner eccentric shaft rotor C are respectively positioned at points $Q_1$, $O_1$ on axis X of perpendicularly intersecting coordinates X and Y whose origin is a center axis P of the bearing base cylinder A. From this position, the outer eccentric shaft rotor B is rotated clockwise through an angle $\theta_1$ by the electrically rotating and driving mechanism and at the same time the inner eccentric shaft rotor C is rotated through an angle $\theta_2$. In that case, the center axis of the inner eccentric shaft rotor C is moved from point $Q_1$ to point $Q_2$ whose coordinate point is $(l_1 \cos \theta_1, l_1 \sin \theta_1)$. On the other hand, the aforesaid movement is combined with the rotational motion of the inner eccentric shaft rotor C, whereby the center axis of the output shaft rotor is moved from point $O_1$ to point $O_2$ whose coordinate point is $\{l_1 \cos \theta_1 + l_2 \cos (\theta_1 + \theta_2), l_1 \sin \theta_1 + l_2 \sin (\theta_1 + \theta_2)\}$.

Accordingly, by suitably independently controlling rotational angles of the outer eccentric shaft rotor B and inner eccentric shaft rotor C, the output shaft rotor D may be thus suitably positioned in the range within a circle of radius $R = l_1 + l_2$ whose center is point P (within a circle indicated by dash-dotted contour lines in FIG. 3). Furthermore output shaft rotor D is rotated by the electrically rotating and driving mechanism to obtain a suitable rotational angle.

Since the eccentric shaft rotor and output shaft rotor themselves respectively form a rotating and driving mechanism which constitutes a motor, they are directly electrically driven and thus rotated. Thus, no gear is used, and therefore no backlash and play occur and high precision position having a high resolving power may be carried out.

According to the present invention, as described above, a composite eccentric shaft rotor and an output shaft rotor are combined, whereby an output shaft may be moved with three degrees of freedom and positionings of translational position and rotational position may be achieved simultaneously. Moreover, the feature of electrically direct driving without using gears or the like is employed, and thus minute movement in units of 1/10 micron becomes possible, providing high precision positioning and high torque.

DESCRIPTION OF THE PREFERRED EMBODIMENT

In the illustrated embodiment, an electrically directly driving positioning device is composed of a bearing base cylinder A, an outer eccentric shaft rotor B, an inner eccentric shaft rotor C and an output shaft rotor D.

Figure 1:
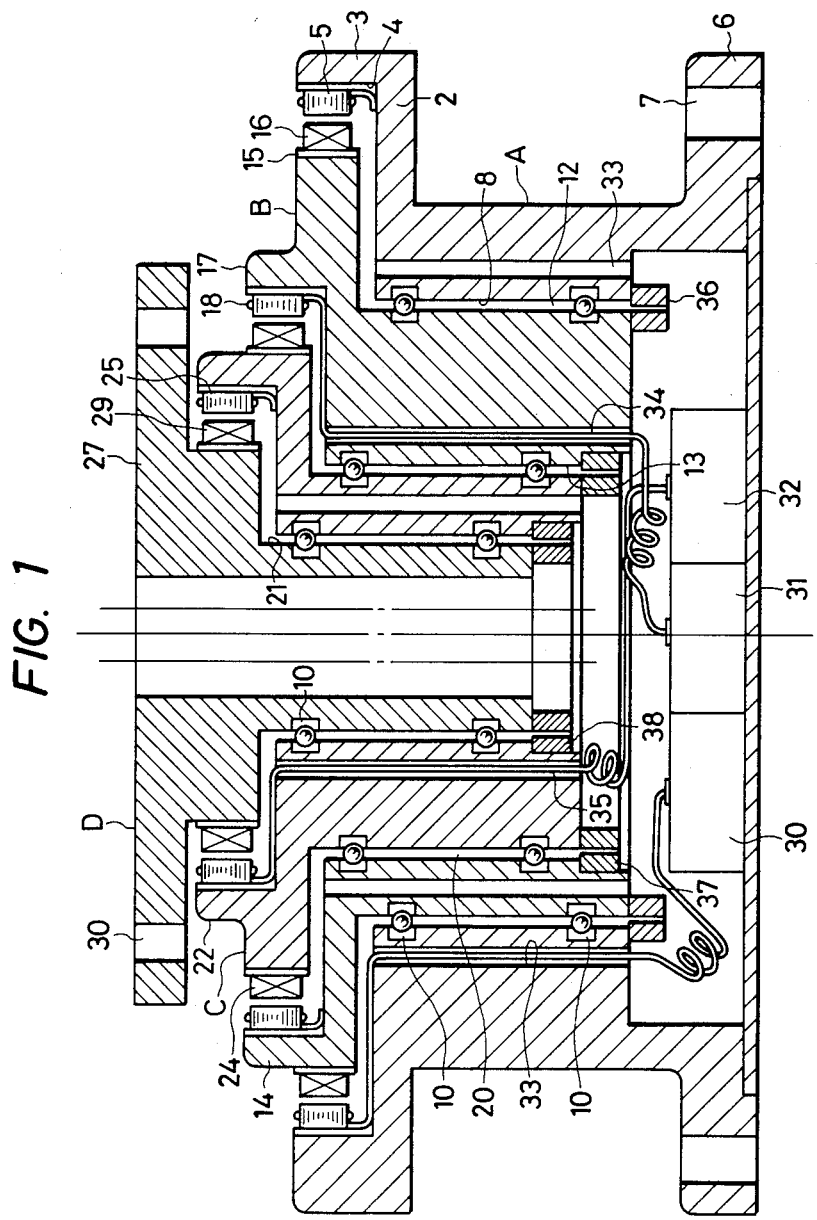
FIG. 1 is a vertical sectional view of an embodiment of a superprecision positioning device according to the present invention.
Figure 2:
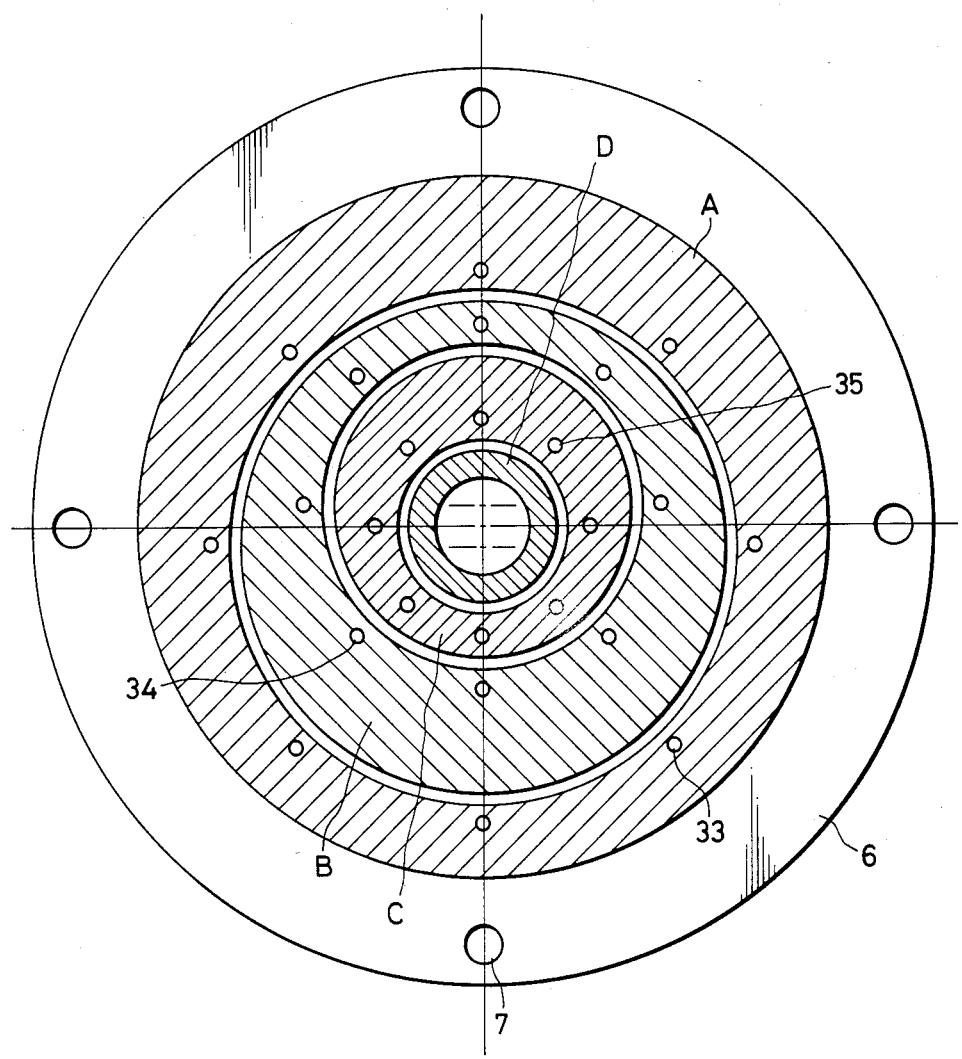
FIG. 2 is a horizontal sectional view of the superprecision positioning device shown in FIG. 1.
Figure 3:
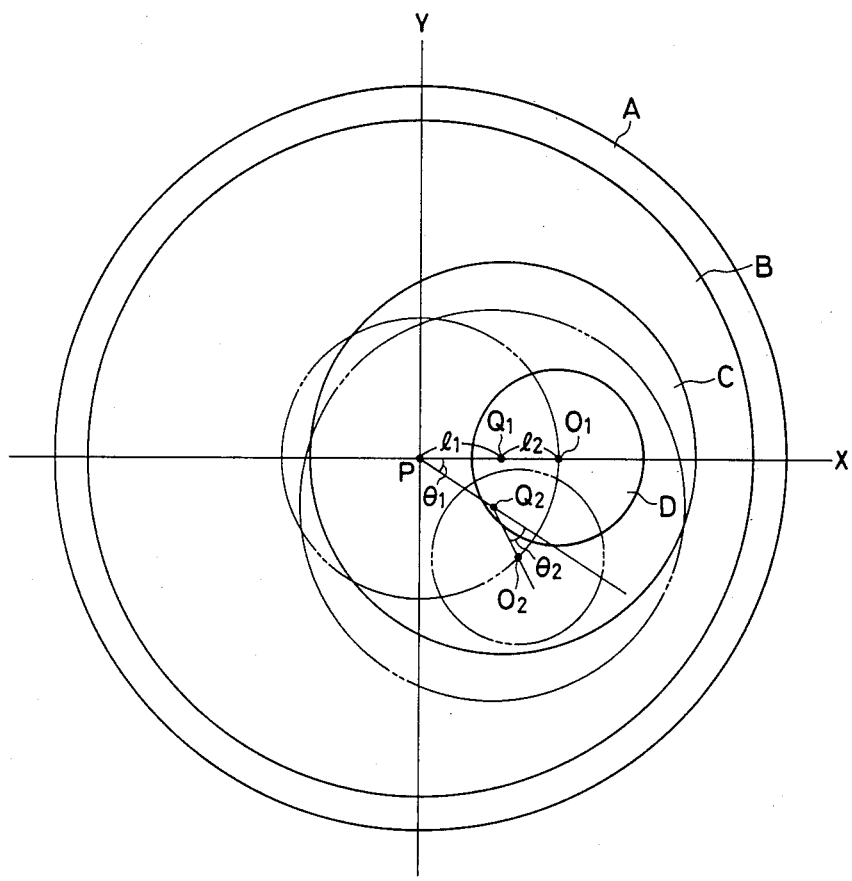
FIG. 3 is an explanatory view of the operation of the device shown in FIG. 1.

As shown in FIG. 3, the bearing base cylinder A has a construction in the form of a concentric cylinder whose center axis is a center axis P of a body of a positioning device. As shown in FIG. 1, the bearing base cylinder A is provided on the upper end with a plate-like flange 2 for supporting an armature winding 5 mounted thereon and constituting an electrically rotating and driving mechanism portion. A flange 6 is positioned on the lower end of bearing base cylinder A for fixing the device body. In the intermediate portion of cylinder a cylindrical inner wall 8 is adapted to receive and support the outer eccentric shaft rotor B. The armature winding 5 is provided on an inner peripheral surface 4 of a cylindrical wall 3 of the plate-like flange 2. Mounting holes 7 are suitably bored in the flange 6 for fixing the device body.

The outer eccentric shaft rotor B has a cylindrical outer wall 12 whose axis is a center axis P of the positioning device body shown in FIG. 3, and a cylindrical inner wall 13 whose center axis $Q_1$ is offset by $l_1$ from the axis P. The rotor B is formed into an eccentric cylindrical shape having on the upper end thereof a plate-like flange 14 for forming an electrically rotating and driving mechanism portion. Rotor B is disposed within the cylindrical inner wall of the bearing base cylinder A and rotatably supported on the bearing base cylinder A through a ball bearing 10. On the outer peripheral wall 15 of the plate-like flange 14 a rotor permanent magnet 16 is provided which faces the armature winding 5 provided on the bearing base cylinder A. The rotor permanent magnet 16 and the armature winding 5 constitute an electrically rotating and driving mechanism portion for driving the outer eccentric shaft rotor B. In the inner peripheral surface of a cylindrical wall 17 of rotor B, an armature winding 18 is provided which constitutes an electrically rotating and driving mechanism portion of the inner eccentric shaft rotor C.

The inner eccentric shaft rotor C is in the form of an eccentric cylinder having at its upper end a plate-like flange 22 for forming a electrically rotating and driving mechanism portion. Rotor C has a cylindrical outer wall 20 whose center axis is an axis $Q_1$, and a cylindrical inner wall 21 whose center axis is an axis $O_1$ offset by $l_2$ from the axis $Q_1$, as shown in FIG. 3. Rotor C is rotatably supported within the cylindrical inner wall 13 of the outer eccentric shaft rotor B through a thrust bearing 10. On the outer peripheral wall of the plate-like flange 22 a rotor permanent magnet 24 is provided which faces the armature winding 18 provided on the outer eccentric rotor B. The rotor permanent magnet 24 and the armature winding 18 constitute an electrically rotating and driving mechanism portion of the inner eccentric rotor C. An armature winding 25 constituting an electrically rotating and driving mechanism portion of the output shaft rotor D is provided on the inner peripheral surface of the plate-like flange 22.

The output shaft rotor D has a construction of a concentric cylinder whose center axis is an axis $O_1$, and on which a table is provided at an upper surface thereof for mounting thereon an article to be positioned by the device. A two-stage flange 27 also serves to support an electrically rotating and driving mechanism portion. Rotor D is rotatably supported within the cylindrical inner wall 21 of the inner eccentric shaft rotor C through a thrust bearing 10. On the outer peripheral wall of the flange 27 a rotor permanent magnet 29 is provided which faces an armature winding 25 provided on the inner eccentric shaft rotor C to constitute an electrically driving portion of the output shaft rotor D. The flange 27 is formed with a plurality of mounting holes 30 so that an article to be positioned thereon may be mounted directly or through a jig.

The armature windings 5, 18 and 25 are connected to independent controllers 30, 31 and 32, respectively, located below the bearing base cylinder A, and are independently driven and controlled by the said controllers. The bearing base cylinder A, the outer eccentric shaft rotor B and the inner eccentric shaft rotor C are formed in their axes with connection holes to facilitate connection between the armature windings 5, 18 and 24 and the controllers 30, 31 and 32.

Rotational positions of the outer eccentric shaft rotor B, the inner eccentric shaft rotor C and the output shaft rotor D are detected with high accuracy by means of pulse encoders 36, 37 and 38, respectively, which form rotation positioning signal generators, provided on the bearing base cylinder A, the outer eccentric shaft rotor B and the inner eccentric shaft rotor C, respectively. Output signals of the pulse encoders 36, 37 and 38 are input to the controllers to control the rotation of each of the rotors.

The electric, direct driving positioning device in the present embodiment is constructed as described above and in use, an article being positioned is fixed onto the upper surface of the flange 27 of the output shaft rotor D. Positioning of an article at a predetermined position is carried out using the following procedure. A central arithmetic operating processor (not shown) arithmetically translates translational positions within the two-dimensional surface into the proper number of revolving pulses of the outer eccentric shaft rotor B and the inner eccentric rotor C, and further arithmetically translates the desired portion of an article being positioned into the proper number of revolving pusles of the output shaft rotor D. The pulse numbers are input to controllers 30, 31 and 32, and the armature windings 5, 18 and 25 are actuated by corresponding output signals from the controllers 30, 31 and 32, thus constituting a motor between the rotor permanent magnets 16, 24 and 29 and windings 5, 18 and 25 respectively, so that each of the rotors is electrically directly rotated and driven. The rotational position of each rotor is detected by the respective pulse encoders 36, 37 and 38, and when a predetermined pulse number is reached, signals are output to the respective controllers to stop the rotation thereof. As shown in FIG. 3, by rotation of the outer eccentric shaft rotor B and inner eccentric shaft C, the output shaft rotor D is positioned to a predetermined position in the range of the circle having the radius $R+l_1+l_2$ whose center axis is point P, by synthesis of rotations of the eccentric shafts C and D, as previously described.

Since each of the rotors according to the present invention itself constitutes a motor and is electrically directly driven, the device has an extremely high resolving power. Therefore, fine movement in units of 1/10 micron may be controlled. Furthermore, since no gears or the like are used, there is no backlash and positioning of translational position and rotational position may be carried out with high accuracy. Moreover, a high torque may be obtained because of the electric, direct driving.

Accordingly, the positioning device of the present invention is suitable for use in fields which call for superprecision positioning such as an industrial robot for assemblying heavy articles calling for high-torque and superprecision positioning, the laser beam focus-position control of a nuclear fusion device or a laser beam processing device calling for superfine movement, positioning used to arrange an integrated circuit, and the like.

With regard to the above-described embodiment, a description has been made of the case where the economic shaft rotor comprises two inner eccentric shaft rotors and outer eccentric shaft rotor. It is to be noted that the eccentric shaft rotors are not limited to two, but a multiple-rotor device using three rotors, which are superposed, for example, may be employed. If the number of eccentric shaft rotors is increased, the translational position may be selected more finely.

Furthermore, while the electrically rotating and driving mechanism portion has been constituted by a permanent magnet and an armature winding, it is to be noted that an ultrasonic motor may be employed in which piezo-electric ceramics are arranged on the inner peripheral wall of the plate-like flange and each rotor is rotated by vibration of said piezo-electric ceramics.

Moreover, while a ball bearing has been employed, it is noted that a pneumatic bearing can also be employed. Furthermore, for a rotation positioning signal generator, a resolver may be employed in place of a pulse encoder. While the positioning device of the present invention is not limited in its material, it is noted that if ceramics are used to form the device, it is possible to prevent the occurrence of fine dust resulting from rust and war, and therefore, the device of the invention is suitable for a positioning device which calls for high cleanliness such as connection processing of an integrated circuit.

Figure 4:
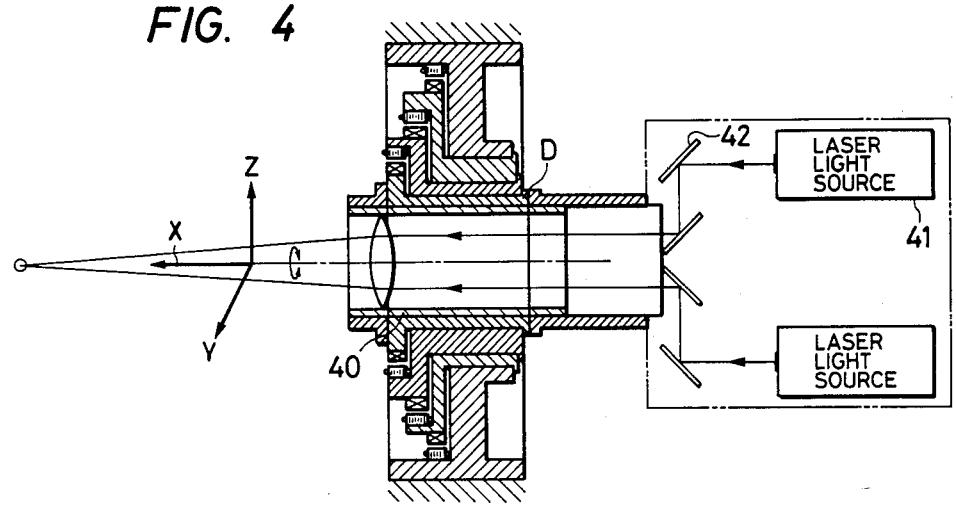
FIG. 4 is a side sectional view of a centering device of a laser beam which applies the device of the present invention.

FIG. 4 shows an example in which the device of the present invention is applied to a laser beam centering device such as a laser beam processor. As shown in FIG. 4, a lens tube is slidably inserted into the output shaft rotor of the device according to the present invention, and a laser light source 41 or a mirror system 42 is secured to the flange portion of the output shaft rotor. Thereby the focus position of the laser beam may select a suitable position within a three-dimensional surface by translational motion of the output shaft rotor D within the two-dimensional surface and sliding movement of the lens tube 40 in an axial direction of the output shaft rotor D, to render possible centering of the laser beam with superprecision.

While in the above-described applied example, the laser light source or mirror system has been fixed to the output shaft rotor D, it is to be noted that suitable means may be employed wherein a part of the mirror system is fixed or a laser beam is directly guided from the laser light source into the lens tube by means of an optic fiber.

Figure 5:
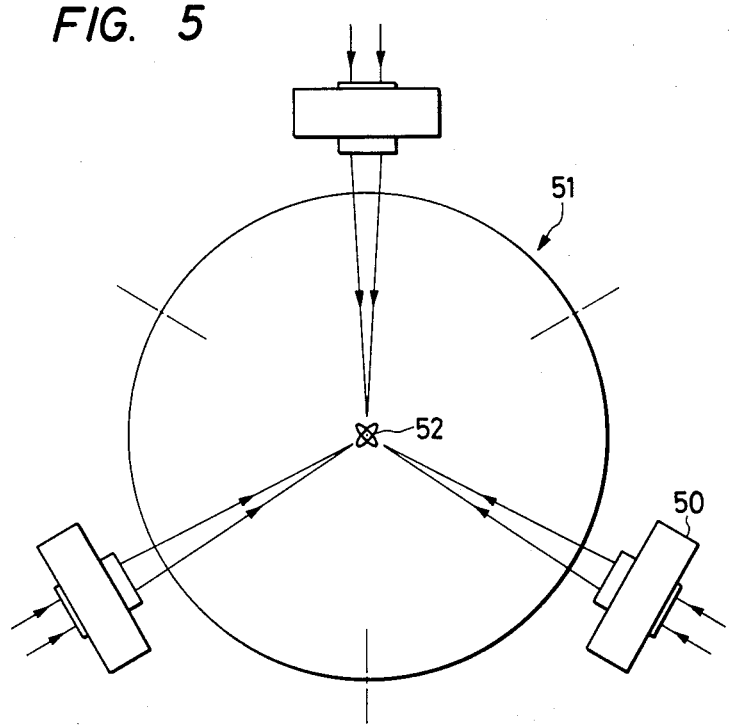
FIG. 5 is a schematic plan view of a nuclear fusion device in which the device of the present invention is applied to a laser beam focus control device.

FIG. 5 shows an applied example in which a laser beam centering device 50 as shown in FIG. 4 is applied to a laser nuclear fusion device 51. In the illustrated example, the device of the present invention is applied to laser beam focus controlling of a laser beam irradiation device for projecting laser beams from three directions onto small pellets 52 falling within a nuclear fusion reactor. Thereby, superprecision focus control of the laser beam becomes possible, and accurate projecting of laser beams from three directions onto small falling pellets 52 may be readily realized.

What is claimed is:

1. A superprecision positioning device, comprising:
a bearing base cylinder;
a plurality of eccentric shaft rotors supported by said bearing base cylinder, including at least an outer eccentric shaft rotor and an inner eccentric shaft rotor;
said outer eccentric shaft rotor having a cylindrical inner wall and a cylindrical outer wall eccentric with respect to one another, wherein said outer eccentric shaft is rotatably supported by a bearing within a cylindrical inner wall of said bearing base cylinder;
said inner eccentric shaft rotor having a cylindrical inner wall and a cylindrical outer wall eccentric with respect to one another, wherein said inner eccentric shaft is rotatably supported by a bearing within said cylindrical inner wall of said outer eccentric shaft rotor;
an output shaft rotor rotatably supported by a bearing within said cylindrical inner wall of said inner eccentric shaft rotor;
a first electric rotational drive means disposed on said bearing base cylinder and said outer eccentric shaft rotor, for directly rotating said outer eccentric shaft rotor with respect to said bearing base cylinder;
a second electric rotational drive means, disposed on said inner and outer eccentric shaft rotors, for directly rotating said inner eccentric shaft rotor with respect to said outer eccentric shaft rotor; and
a third electric rotational drive means, disposed on said inner eccentric shaft rotor and said output shaft rotor, for directly rotating said output shaft rotor with respect to said inner eccentric shaft rotor, such that said outer eccentric shaft rotor, said inner eccentric shaft rotor, and said output shaft rotor are each rotatable independently from one another.

2. The positioning device of claim 1 wherein each of said electric rotational drive means comprises a permanent magnet and an armature winding.

3. The positioning device of claim 1 wherein each of said electric rotational drive means comprises an ultrasonic motor in which piezo-electric ceramics are connected to a cylindrical inner wall.

4. The positioning device of any one of claims 1, 2, or 3 wherein said bearings are ball-and-roller bearings.

5. The positioning device of any one of claims 1, 2, or 3 wherein said bearings are pneumatic bearings.

* * * * *